(12) United States Patent
Kim et al.

(10) Patent No.: US 8,509,004 B2
(45) Date of Patent: Aug. 13, 2013

(54) NONVOLATILE LOGIC CIRCUIT, INTEGRATED CIRCUIT INCLUDING THE NONVOLATILE LOGIC CIRCUIT, AND METHOD OF OPERATING THE INTEGRATED CIRCUIT

(75) Inventors: Ho-jung Kim, Yongin-si (KR); Jai-kwang Shin, Yongin-si (KR); Kwang-seok Kim, Yongin-si (KR); Kee-won Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 453 days.

(21) Appl. No.: 12/801,502

(22) Filed: Jun. 11, 2010

(65) Prior Publication Data

US 2011/0122709 A1    May 26, 2011

(30) Foreign Application Priority Data

Nov. 24, 2009   (KR) .................. 10-2009-0114064

(51) Int. Cl.
*G11C 7/10*    (2006.01)
(52) U.S. Cl.
USPC ...................... 365/189.05; 365/158
(58) Field of Classification Search
USPC ............................ 365/189.05, 158
See application file for complete search history.

(56) References Cited

U.S. PATENT DOCUMENTS

| 7,439,770 | B2 | 10/2008 | Kim et al. | |
|---|---|---|---|---|
| 2004/0105301 | A1* | 6/2004 | Toyoda et al. | 365/154 |
| 2008/0013369 | A1 | 1/2008 | Kim et al. | |
| 2010/0271866 | A1* | 10/2010 | Sakimura et al. | 365/158 |

FOREIGN PATENT DOCUMENTS

| JP | 2004-118923 A | 4/2004 |
|---|---|---|
| JP | 2006-146983 A | 6/2006 |
| JP | 2007-123637 A | 5/2007 |
| KR | 10-0682967 B1 | 2/2007 |

* cited by examiner

*Primary Examiner* — Michael Tran
(74) *Attorney, Agent, or Firm* — Harness, Dickey & Pierce, P.L.C.

(57) ABSTRACT

A nonvolatile logic circuit includes a latch unit including a pair of first and second latch nodes; and a pair of first and second nonvolatile memory cells electrically connected to the first and second of latch nodes, respectively. A write operation is performed on the first and second nonvolatile memory cells according to a direction of a current flowing through the first and second nonvolatile memory cells when a write enable signal is activated. The direction of flow of current determined based on data on the respective first and second latch nodes, and a logic value written on the first nonvolatile memory cells is different from a logic value written on the second nonvolatile memory cell.

24 Claims, 14 Drawing Sheets

NONVOLATILE LOGIC CIRCUIT, INTEGRATED CIRCUIT INCLUDING THE NONVOLATILE LOGIC CIRCUIT, AND METHOD OF OPERATING THE INTEGRATED CIRCUIT

CROSS-REFERENCE TO RELATED APPLICATIONS

This application claims priority under 35 U.S.C. §119 to Korean Patent Application No. 10-2009-0114064, filed on Nov. 24, 2009, in the Korean Intellectual Property Office (KIPO), the disclosure of which is incorporated herein in its entirety by reference.

BACKGROUND

1. Field

Example embodiments relate to a nonvolatile logic circuit, and particularly, to a nonvolatile logic circuit including a nonvolatile memory device, an integrated circuit including the nonvolatile logic circuit, and a method of operating the integrated circuit.

2. Description

Next generation memory devices may have a relatively higher storage capacity and may consume relatively less power. These devices may also not require refreshing data stored therein. The next-generation memory devices include, for example, Phase Change Random Access Memory (PRAM), Nano Floating Gate Memory (NFGM), Polymer RAM (PoRAM), Magnetic RAM (MRAM), Ferroelectric RAM (FeRAM), and Resistive RAM (RRAM). These next-generation memory devices may be included in logic circuits.

SUMMARY

According to example embodiments, a nonvolatile logic circuit may include a latch unit including a pair of first and second latch nodes; and a pair of first and second nonvolatile memory cells electrically connected to the first and second of latch nodes, respectively.

According to example embodiments, a write operation may be performed on the first and second nonvolatile memory cells by supplying current to the first and second nonvolatile memory cells in different direction when a write enable signal is activated, the direction of flow of current determined based on a logic value of data stored on the respective first and second latch nodes. A logic value stored in the first nonvolatile memory cells may be different from a logic value stored in the second nonvolatile memory cell.

According to example embodiments, when a read enable signal is activated, the first and second nonvolatile memory cells may be electrically connected to the first and second latch nodes, respectively, and the logic value written to the respective first and second nonvolatile memory cells may be provided to the respective first and second latch nodes.

According to example embodiments, the first and second nonvolatile memory cells may not be electrically connected to the respective first and second latch nodes when the read enable signal and the write enable signal are not activated.

According to example embodiments, the nonvolatile logic circuit may further include an inverter configured to invert an input data and to output an inverted input data; a first transmission unit configured to transmit the input data to the first latch node when a read enable signal is not activated; and a second transmission unit configured to transmit the inverted input data to the second latch node when the read enable signal is not activated.

According to example embodiments, the nonvolatile logic circuit may further include a read operation selection unit configured to provide the logic value stored in the first nonvolatile memory cell to the first latch node and the logic value stored in the second nonvolatile memory cell to the second latch node, when the read enable signal is activated; and a write operation selection unit configured to supply the currents to the first and second nonvolatile memory cells when the write enable signal is activated.

According to example embodiments, the nonvolatile logic circuit may further include an equalization unit configured to connect the first and second latch nodes when a pulse signal is activated, wherein connecting the first and second latch nodes equalizes voltage levels of the data stored on the first and second latch nodes.

According to example embodiments, the write operation selection unit may include a write switch configured to connect the first and second nonvolatile memory cells to form a closed circuit including the first and second latch nodes and the first and second nonvolatile memory cells when the write enable signal is activated.

According to example embodiments, the read operation selection unit may include first and second read switches configured to connect the first and second nonvolatile memory cells to a ground voltage terminal when the read enable signal is activated.

According to example embodiments, the nonvolatile logic circuit may further include an auxiliary read unit configured to perform a read operation on the first and second nonvolatile memory cells. The auxiliary read unit may includes a first auxiliary switch that is switched on/off according to the data stored in the second nonvolatile memory cell, and is configured to connect the first nonvolatile memory cell to the first read switch; and a second auxiliary switch that is switched on/off according to the data stored in the first nonvolatile memory cell and is configured to connect the second nonvolatile memory cell to the second read switch.

According to example embodiments, the nonvolatile logic circuit may further include an auxiliary read unit configured to perform a read operation on the first and second nonvolatile memory cells. The auxiliary read unit may include a first auxiliary switch that is switched on/off according to the data of the second latch node, and is configured to connect the first nonvolatile memory cell to the first read switch; and a second auxiliary switch that is switched on/off according to the data of the first latch node and is configured to connect the second nonvolatile memory cell to the second read switch.

According to example embodiments, the nonvolatile logic circuit may further include an auxiliary read unit configured to perform a read operation on the first and second nonvolatile memory cells. The auxiliary read unit may includes first and second transmission switches that are switched on/off according to the read enable signal and respectively transmit the data of the first and second latch nodes; a first auxiliary switch that is switched on/off according to an output of the second transmission switch and is configured to connect the first latch node to the first nonvolatile memory cell; and a second auxiliary switch that is switched on/off according to an output of the first transmission switch and is configured to connect the second latch node to the second nonvolatile memory cell.

According to example embodiments, a logic circuit may include a master latch configured to latch input data; and a slave latch configured to latch output data of the master latch.

The slave latch may include the nonvolatile logic circuit according to example embodiments.

According to example embodiments, the nonvolatile logic circuit further includes an inverter configured to invert the output data of the master latch and to output an inverted output data; a first transmission unit configured to transmit the output data of the master latch to the first latch node when a read enable signal is not activated; and a second transmission unit configured to transmit the inverted output data to the second latch node when the read enable signal is not activated.

According to example embodiments, the nonvolatile logic circuit further includes a read operation selection unit configured to provide the data stored in the first nonvolatile memory cell to the first latch node and the data stored in the second nonvolatile memory cell to the second latch node when the read enable signal is activated; and a write operation selection unit configured to supply currents to the first and second nonvolatile memory cells when the write enable signal is activated.

According to example embodiments, the nonvolatile logic circuit further includes an equalization unit configured to connect the first and second latch nodes when a pulse signal is activated, wherein connecting the first and second latch nodes equalizes voltage levels of the data stored on the first and second latch nodes.

According to example embodiments, the logic circuit may include a first transmission gate configured to transmit the input data to the master latch according to a clock signal and an inverted clock signal; and a second transmission gate configured to transmit the output data of the master latch to the slave latch according to the clock signal and the inverted clock signal.

According to example embodiments, the slave latch may further include an inverter configured to invert data stored on the second latch node; and a third transmission gate configured to transmit an output of the inverter to an output terminal of the second transmission gate according to the clock signal and the inverted clock signal.

According to example embodiments, an integrated circuit includes a plurality of circuit blocks including at least one logic circuit block and at least one nonvolatile logic circuit according to example embodiments; a power sensor configured to generate a sense signal when a value of a power supplied to at least one of the plurality of circuit blocks is less than or equal to a threshold value; and a controller configured to generate a read enable signal or the write enable signal based on the sense signal generated by the power sensor or an external command. The first and second latch nodes of the nonvolatile logic circuit are configured to latch an output data of the at least one logic circuit block or an external input data.

According to example embodiments, the at least one nonvolatile logic circuit further includes an inverter configured to invert the output data of the at least one logic circuit block or the external input data, and the inverter configured to output inverted data; a first transmission unit configured to transmit the output data of the at least one logic circuit block or the external input data to the first latch node when the read enable signal is not activated; and a second transmission unit configured to transmit the inverted data to the second latch node when the read enable signal is not activated.

According to example embodiments, the at least one nonvolatile logic circuit further includes a read operation selection unit configured to provide data stored in the first nonvolatile memory cell to the first latch node and data stored in the second nonvolatile memory cell to the second latch node when the read enable signal is activated; and a write operation selection unit configured to supply currents to the first and second nonvolatile memory cells when the write enable signal is activated.

According to example embodiments, the at least one nonvolatile logic circuit further includes an equalization unit configured to connect the first and second latch nodes when a pulse signal is activated, wherein connecting the first and second latch nodes equalizes voltage levels of the data stored on the first and second latch nodes.

According to example embodiments, a method of operating an integrated circuit including at least one nonvolatile logic circuit and at least one logic circuit block, the at least one nonvolatile logic circuit including a latch unit, the latch unit including a pair of first and second latch nodes and a pair of first and second nonvolatile memory cells, may include generating a sense signal when a value of a power supplied to the at least one logic circuit block is less than or equal to a threshold value; generating a read enable signal or a write enable signal based on the sense signal or an external command; electrically connecting the first and second nonvolatile memory cells to the first and second latch nodes, respectively, when the write enable signal is activated; and performing a write operation on the first and second nonvolatile memory cells by supplying current to the first and second nonvolatile memory cells in different directions based on data stored on the respective first and second latch nodes. A logic value stored in the first nonvolatile memory cell may be different from a logic value stored in the second nonvolatile memory cells.

According to example embodiments. The method may further include inverting an output of the at least one logic circuit block or an external input data to produce an inverted output data and outputting the inverted output data; and transmitting the output of the at least one logic circuit block or the external input data to the first latch node and the inverted output data to the second latch node when the read enable signal is not activated.

According to example embodiments, the method may further include disconnecting the first and second nonvolatile memory cells from the first and second latch nodes when the read enable signal and the write enable signal are not activated; or providing the data stored in the first and second nonvolatile memory cells to the first and second latch nodes, respectively, when the read enable signal is activated.

According to example embodiments, the method may further include equalizing voltages of the data stored on the first and second latch nodes by connecting the first and second latch nodes to each other when a pulse signal is activated.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
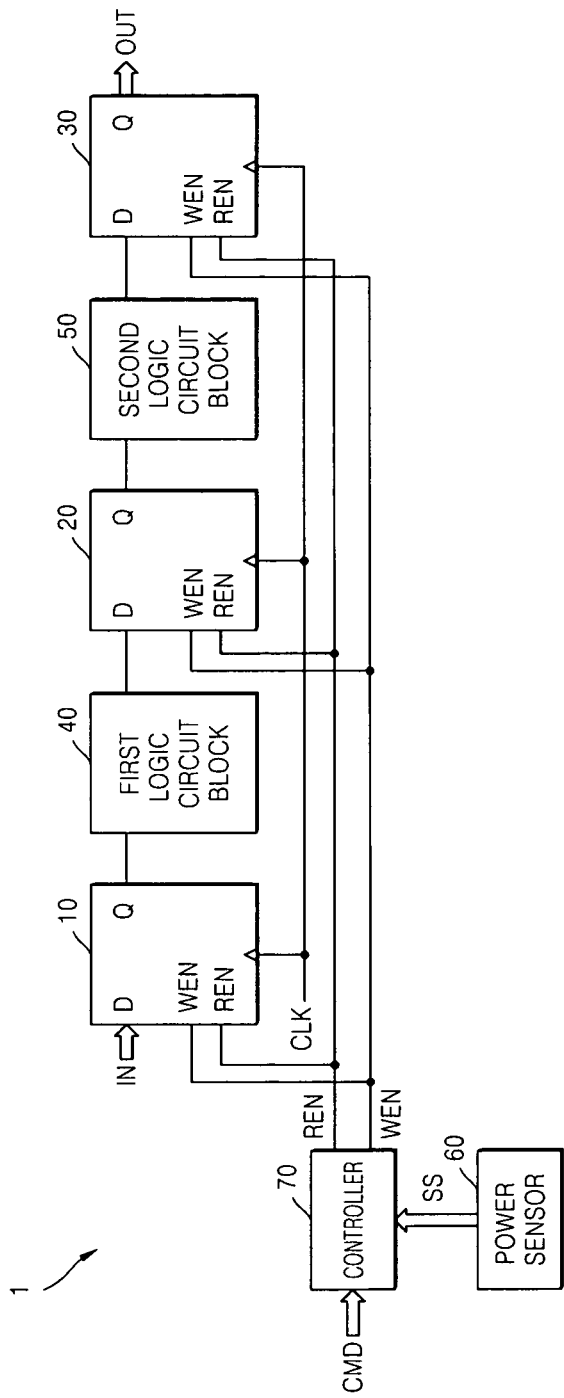
FIG. 1 is a block diagram of an integrated circuit according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of an integrated circuit 1 according to example embodiments. Referring to FIG. 1, the integrated circuit 1 may be embodied as a single chip in one electronic system and may include a plurality of circuit blocks 10 to 50, a power sensor 60, and a controller 70. The plurality of circuit blocks 10 to 50 may include first to third flip flops 10 to 30 and first and second logic circuit blocks 40 and 50. FIG. 1 illustrates three flip flops 10 to 30 and two logic circuit blocks 40 and 50 for the sake of brevity, and the integrated circuit 1 may include more (or less) than three flip flops and more (or less) than two logic circuit blocks.

According to example embodiments, the first to third flip flops 10 to 30 may be nonvolatile flip flops each having a pair of nonvolatile memory cells. The nonvolatile flip flops are described below.

The first flip flop 10 may receive an external input data IN, and latch the input data IN in synchronization with a clock signal CLK. The first logic circuit block 40 may perform a logic operation on data output from the first flip flop 10. The second flip flop 20 may receive the output data of the first logic circuit block 40, and latch the output data in synchronization with the clock signal CLK. The second logic circuit block 50 may perform a logic operation on output data of the second flip flop 20. The third flip flop 30 may receive output data of the second logic circuit block 50, and latch the output data in synchronization with the clock signal CLK. As described above, the first to third flip flops 10 to 30 may perform a normal latch operation such that signals in the integrated circuit 1 may be synchronized with the clock signal CLK.

Also, in each of the first to third flip flops 10 to 30, a write operation or a read operation may be performed on the pair of nonvolatile memory cells based on a write enable signal WEN or a read enable signal REN. The write or read operation may be performed on the pair of nonvolatile memory cells when the write enable signal WEN or the read enable signal REN is activated and a normal latch operation may be performed when the write enable signal WEN and the read enable signal REN are not activated. The operations of the flip flops 10 to 30 are described below.

The power sensor 60 may sense power supplied to the integrated circuit 1 and may generate a sense signal SS when the value of the power is less than or equal to a desired threshold. The power sensor 60 may generate the sense signal SS by sensing power supplied to at least one of the plurality of circuit blocks 10 to 50 included in the integrated circuit 1.

The controller 70 may activate a read enable signal REN or a write enable signal WEN, based on an external command CMD and/or the sense signal SS generated by the power sensor 60. For example, if boot code needs to be updated, a user may generate a write command W_CMD. In this case, the controller 70 may activate the write enable signal WEN according to the write command W_CMD. When a booting operating is performed in the integrated circuit 1 or power supplied to the integrated circuit 1 is turned on, a user may generate a read command R_CMD. In this case, the controller 70 may activate the read enable signal REN according to the read command R_CMD.

Figure 2:
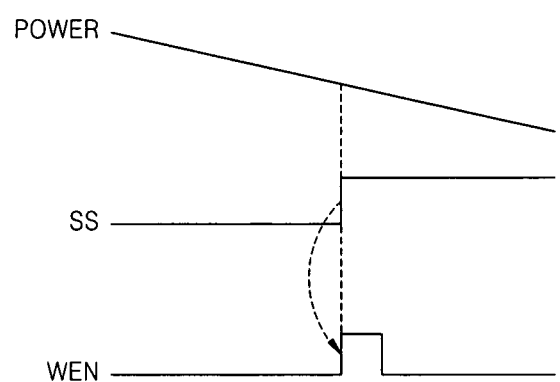
FIG. 2 is a timing diagram illustrating the operations of a power sensor and a controller included in the integrated circuit of FIG. 1, according to example embodiments.

FIG. 2 is a timing diagram illustrating the operations of the power sensor 60 and the controller 70 of FIG. 1 according to example embodiments. Referring to FIGS. 1 and 2, if a value of power supplied to the integrated circuit 1 is less than or equal to a desired threshold, then the power sensor 60 may generate a sense signal SS. When the sense signal SS is generated, the controller 70 may activate a write enable signal WEN. In this case, the activated write enable signal WEN may be supplied to the first to third flip flops 10 to 30. In each of the flip flops 10 to 30, a write operation may be performed on the pair of nonvolatile memory cells based on the activated write enable signal WEN.

Figure 3:
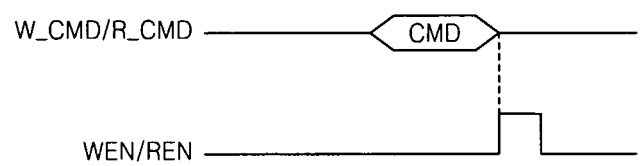
FIG. 3 is a timing diagram illustrating the operation of the controller included in the integrated circuit of FIG. 1, according to example embodiments.

FIG. 3 is a timing diagram illustrating the operation of the controller included in the integrated circuit of FIG. 1 according to example embodiments. Referring to FIGS. 1 and 3, when a write command W_CMD or a read command R_CMD is input to the controller 70, the controller may activate a write enable signal WEN or a read enable signal REN. In this case, the activated write enable signal WEN or read enable signal REN may be supplied to the first to third flip flops 10 to 30. In each of the flip flops 10 to 30, a read operation may be performed on the pair of nonvolatile memory cells according to the activated read enable signal REN. Also, in each of the flip flops 10 to 30, a write operation may be performed on the pair of nonvolatile memory cells according to the activated write enable signal WEN.

The operations of the flip flops 10 to 30 according to a write enable signal WEN and a read enable signal REN is described with reference to FIG. 1.

If the value of power supplied to the integrated circuit 1 is maintained at a constant level or an external command is not received, then the controller 70 may not activate the write enable signal WEN and the read enable signal REN and the flip flops 10 to 30 may function as normal latches. If an external read command R_CMD is received, the controller 70 may activate the read enable signal REN and the read operation may be performed on the pair of nonvolatile memory cells in each of the flip flops 10 to 30. If the value of the power supplied to the integrated circuit 1 is less than or equal to a desired threshold or an external write command W_CMD is received, then the controller 70 may activate the write enable signal WEN and a write operation may be performed on the pair of nonvolatile memory cells in each of the flip flops 10 to 30.

Thus, if the power supply to the integrated circuit 1 is disconnected, the power sensor 60 may generate a sense signal SS before the power supply is disconnected and the controller 70 may activate write enable signal WEN, so that the write operation may be performed on the pair of nonvolatile memory cells in the flip flops 10 to 30. Thus, the operating results of the logic circuit blocks 40 and 50 included in the integrated circuit 1 may be stored in the flip flops 10 to 30 before the supply of the power is discontinued.

When power is supplied again to the integrated circuit 1, the controller 70 may activate the read enable signal REN so that data may be read from the pair of nonvolatile memory cells in each of the flip flops 10 to 30 in order to load the boot code into the integrated circuit 1. Thus, when power is supplied again to the integrated circuit 1, the data stored in the pair of nonvolatile memory cells in each of the flip flops 10 to 30 may be loaded into the integrated circuit 1 in order to boot the integrated circuit 1 without having to access to an external ROM, thereby reducing an amount of time needed for the booting.

If a nonvolatile memory cell is included in a logic circuit, such as a flip flop, then the nonvolatile memory cell may have a relatively high reliability. In other words, it is expected that writing can be performed on the nonvolatile memory cell an unlimited (theoretically) number of times. However, practically, writing can be performed on the write nonvolatile memory cells about $10^5$ to about $10^6$ times. Thus, if a nonvolatile memory cell is included in a logic circuit, when writing is continuously performed on the nonvolatile memory cell while power is supplied to the logic circuit according to data input to the logic circuit, the logic circuit may reliably perform operations a finite number of times.

According to example embodiments, writing may be performed on the pair of nonvolatile memory cells in the each of the flip flops 10 to 30 only when the write enable signal WEN is supplied to each of the flip flops 10 to 30 and the write enable signal WEN is activated. Accordingly, although each of the nonvolatile memory cells has finite reliability, the number of times that writing is performed on the nonvolatile memory cell may be reduced thus increasing the reliability of the flip flops 10 to 30.

Figure 4:
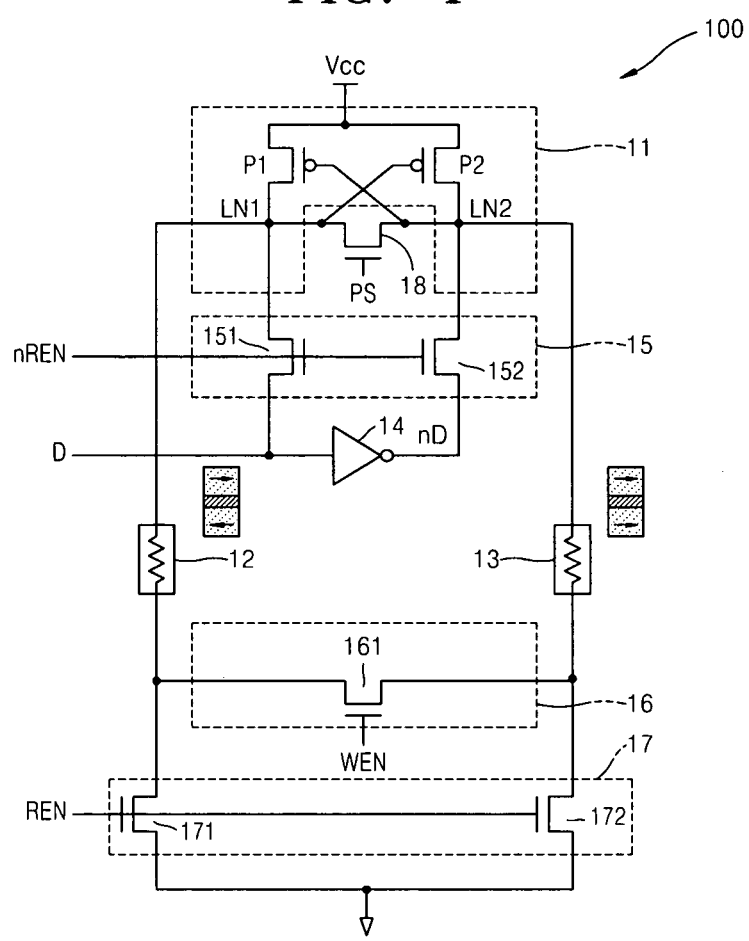
FIG. 4 is a circuit diagram of a latch circuit included in a flip flop of the integrated circuit of FIG. 1, according to example embodiments.

FIG. 4 is a circuit diagram of a latch circuit 100 included in each of the flip flops 30 to 50 of FIG. 1, according to example embodiments. Referring to FIG. 4, the latch circuit 100 may include a latch unit 11, first and second nonvolatile memory cells 12 and 13, an inverter 14, a transmission unit 15, a write operation selection unit 16, a read operation selection unit 17, and an equalization unit 18.

The latch unit 11 may include first and second latch nodes LN1 and LN2, and first and second PMOS transistors P1 and P2 that are cross coupled to each other. The first PMOS transistor P1 includes a source connected to a power supply voltage terminal Vcc, a drain connected to the first latch node LN1, and a gate connected to the second latch node LN2. The second PMOS transistor P2 includes a source connected to the power supply voltage terminal Vcc, a drain connected to the second latch node LN2, and a gate connected to the first latch node LN1. However, the structure of the latch unit 11 is not limited thereto, and, the latch unit 11 may include two cross coupled inverters, for example.

The first and second nonvolatile memory cells 12 and 13 may retain data stored therein even when power is cut-off.

For example, the first and second nonvolatile memory cells 12 and 13 may be resistive memory devices. The resistance values of the resistive memory devices may change according to a magnitude of a voltage or a current applied thereto and a direction in which a voltage or a current is applied thereto, thus, the resistive memory devices may have a reset state (a high resistance state) or a set state (a low resistance state).

That is, the state of each of resistive memory devices changes to a high or low resistance state when a voltage or a current pulse is applied thereto. Thus, resistive memory devices may store information by using the high and low resistance states as bit information. In this case, resistive memory devices may have a reset or set state according to not only the magnitude but also the direction of a voltage or a current applied thereto and may be thus used as bipolar memory devices.

In another example, the first and second nonvolatile memory cells 12 and 13 may be magnetic memory devices. The direction of magnetization of the magnetic memory devices may change according to a direction in which a voltage or a current is applied thereto, thus, the magnetic memory devices may have a high or low resistance state. A magnetic memory device may have a structure in which a ferromagnetic substance, an insulator, and a ferromagnetic substance are arranged sequentially. The magnetic memory device may have a low resistance state when the directions of magnetization of the two ferromagnetic substances are the same and may have a high resistance state when the directions of magnetization of the two ferromagnetic substances are different from each other. Therefore, the magnetic memory device may store information by using the high and low resistance states as bit information.

However, the first and second nonvolatile memory cells 12 and 13 are not limited to resistive memory devices or magnetic memory devices and may be various types of memory devices, such as flash memory devices, PRAM, or FeRAM.

The inverter 14 may invert input data D input to the latch circuit 100 and output inverted input data nD. The transmission unit 15 may include first and second transmission units 151 and 152 that are controlled according to a read enable signal REN. If the read enable signal REN is not activated, the first transmission unit 151 delivers the input data D to the first latch node LN1 and the second transmission unit 152 delivers the inverted input data nD to the second latch node LN2. The first and second transmission units 151 and 152 may have an NMOS transistor that is turned on or off according to inverted read enable signal nREN.

If a write enable signal WEN is activated, then the write operation selection unit 16 may supply current to the first and second nonvolatile memory cells 12 and 13 in opposite directions, respectively, according to a direction of current determined by data delivered to a the first and second latch nodes LN1 and LN2. In other words, the write operation selection unit 16 may include a write switch 161 that is switched on or off according to the write enable signal WEN. If the write enable signal WEN is activated, the write switch 161 may connect the first and second nonvolatile memory cells 12 and 13 to each other so that the first and second latch nodes LN1 and LN2 and the first and second nonvolatile memory cells 12 and 13 may form a closed circuit together. Thus, a write operation may be performed on the first and second nonvolatile memory cells 12 and 13 according to the data delivered to the first and second latch nodes LN1 and LN2. The operation of the write operation selection unit 16 is described later with reference to FIG. 6.

If the read enable signal REN is activated, then the read operation selection unit 17 may provide the data stored in the first nonvolatile memory cell 12 to the first latch node LN1 and may provide the data stored in the second nonvolatile memory cell 13 to the second latch node LN2. The read operation selection unit 17 may include first and second read switches 171 and 172 that are switched on or off according to the read enable signal REN. If the read enable signal REN is activated, then the first read switch 171 connects the first nonvolatile memory cell 12 to a ground voltage terminal and the second read switch 172 connects the second nonvolatile memory cell 13 to the ground voltage terminal. Thus, the data stored in the first and second nonvolatile memory cells 12 and 13 may be transmitted to the first and second latch nodes LN1 and LN2, respectively, thereby performing a read operation. The operation of the read operation selection unit 17 is described later with reference to FIG. 7.

The equalization unit 18 may be connected between the first latch node LN1 and the second latch node LN2 in order to equalize voltages of the first latch node LN1 and the second latch node LN2 when a pulse signal PS having a desired pulse width is supplied to the equalization unit 18. The equalization unit 18 may be embodied as an NMOS transistor having a gate to which the pulse signal PS is supplied. Thus, when the pulse signal PS is activated, that is, it is logic 'high', the first latch node LN1 and the second latch node LN2 are connected to each other, thereby equalizing the voltage of the first latch node LN1 with that of the second latch node LN2.

Figure 5:
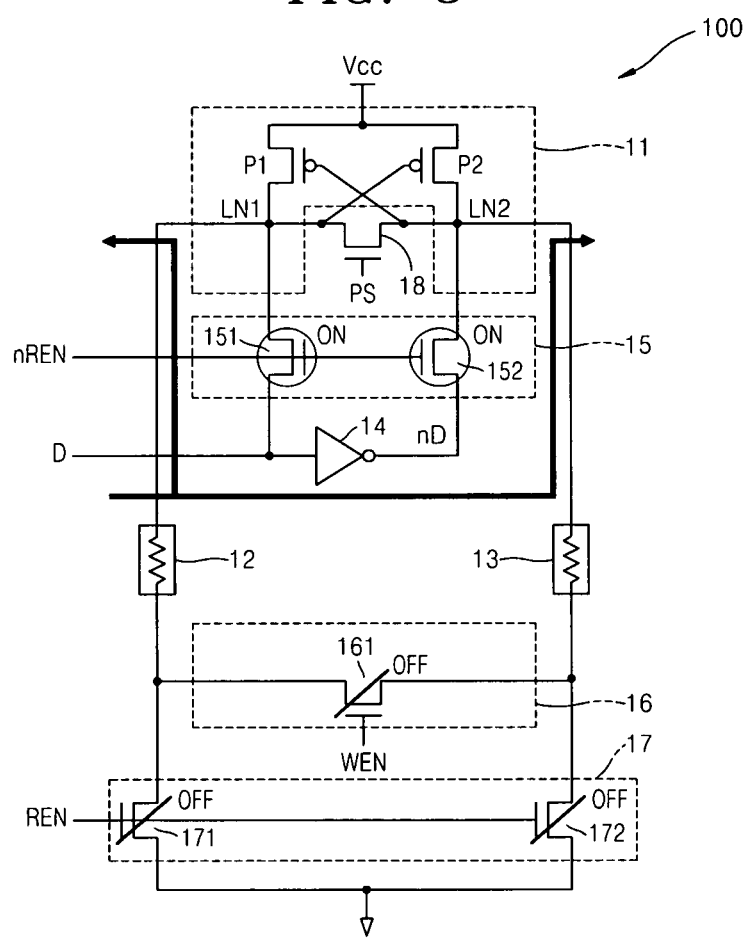
FIG. 5 is a circuit diagram illustrating a normal operation of the latch circuit of FIG. 4, according to example embodiments.

The pulse signal PS is activated when the read operation is performed on the first and second nonvolatile memory cells 12 and 13. Thus, the data may be read from the first and second nonvolatile memory cells 12 and 13 by equalizing the voltages of the first latch node LN1 and the second latch node LN2 when pulse signal PS is activated and by transmitting the data stored in the first and second nonvolatile memory cells 12 and 13 to the first latch node LN1 and the second latch node LN2, respectively, when the pulse signal PS is deactivated FIG. 5 is a circuit diagram illustrating a normal operation of the latch circuit 100 of FIG. 4, according to example embodiments. Referring to FIG. 5, when a normal operation of the latch circuit 100 is performed, a read enable signal REN and a write enable signal WEN are not activated and a pulse signal PS is not activated. Thus, the first and second transmission units 151 and 152 are activated to deliver input data D and inverted input data nD to the first and second latch nodes LN1 and LN2, respectively. The write switch 161 of the write operation selection unit 16 is open, the first and second read switches 171 and 172 of the read operation selection unit 17 are also open, and the equalization unit 18 is deactivated. Thus, the latch unit 11 is not connected to the first and second nonvolatile memory cells 12 and 13, and the latch circuit 100 acts as a normal latch circuit.

Figure 6:
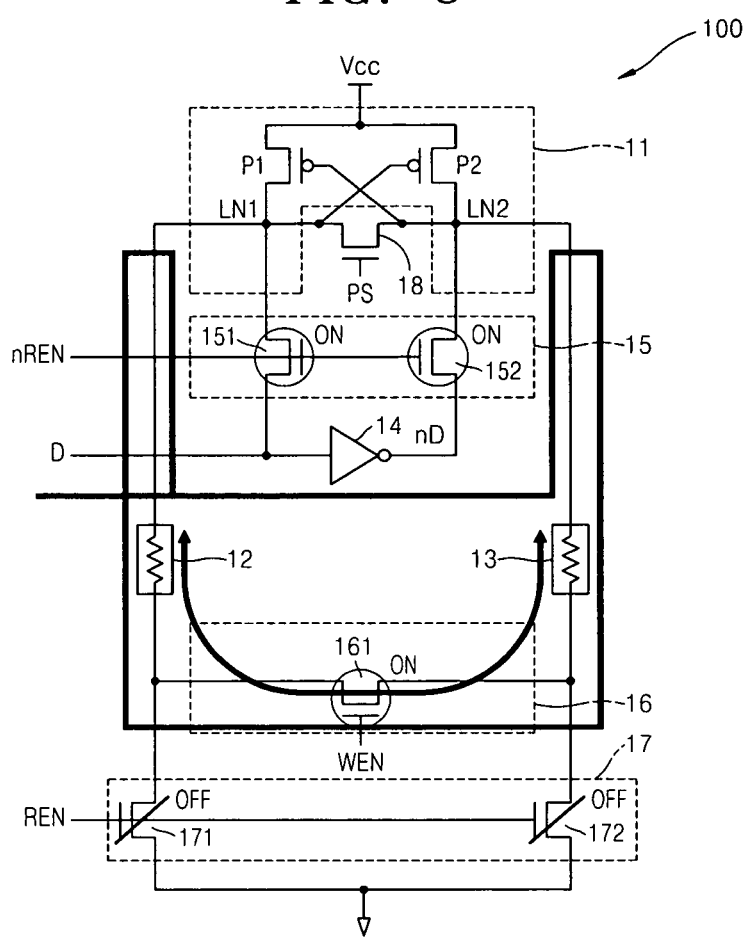
FIG. 6 is a circuit diagram illustrating a write operation performed by the latch circuit of FIG. 4, according to example embodiments.

FIG. 6 is a circuit diagram illustrating a write operation performed by the latch circuit 100 of FIG. 4, according to example embodiments. Referring to FIG. 6, when the latch circuit 100 performs the write operation, a write enable signal WEN is activated, and a read enable signal REN and a pulse signal PS are not activated. Thus, the first and second transmission units 151 and 152 are activated to deliver input data D and inverted input data nD to the first and second latch nodes LN1 and LN2, respectively. The write switch 161 of the write operation selection unit 16 is closed, the first and second read switches 171 and 172 of the read operation selection unit 17 are open, and the equalization unit 18 is deactivated.

Accordingly, the first and second latch nodes LN1 and LN2 and the first and second nonvolatile memory cells 12 and 13 form a closed circuit together, as marked by a solid line in FIG. 6. In this case, since the input data D delivered to the first latch node LN1 and the inverted input data nD delivered to the data delivered to the second latch node LN2 have opposite logic values, the direction of current flowing through the closed circuit may be determined by the input data D and the inverted input data nD delivered to the respective first and second latch nodes LN1 and LN2.

If the input data D delivered to the first latch node LN1 is logic 'high' and the inverted input data nD delivered to the second latch node LN2 is logic 'low', then current flows in a direction from the first latch node LN1 to the first nonvolatile memory cell 12. Thus, the current is supplied downward, for example, in a first direction, to the first nonvolatile memory cell 12 and is supplied upward, for example, in a second direction, to the second nonvolatile memory cell 13. Since the current is supplied to the first and second nonvolatile memory cells 12 and 13 in different directions, respectively, a logic value of data written to the first nonvolatile memory cell 12 is different from that of data written to the second nonvolatile memory cell 13.

If the input data D delivered to the first latch node LN1 is logic 'low' and the inverted input data nD delivered to the second latch node LN2 is logic 'high', then current flows in a direction from the second latch node LN2 to the second nonvolatile memory cell 13. Thus, the current is supplied downward, for example, in the first direction, to the second nonvolatile memory cell 13 and is supplied upward, for example, in the second direction, to the first nonvolatile memory cell 12. Since the current is supplied to the first and second nonvolatile memory cells 12 and 13 in different directions, respectively, a logic value of data written to the first nonvolatile memory cells 12 is different from that of data written to the second nonvolatile memory cell 13.

Figure 7:
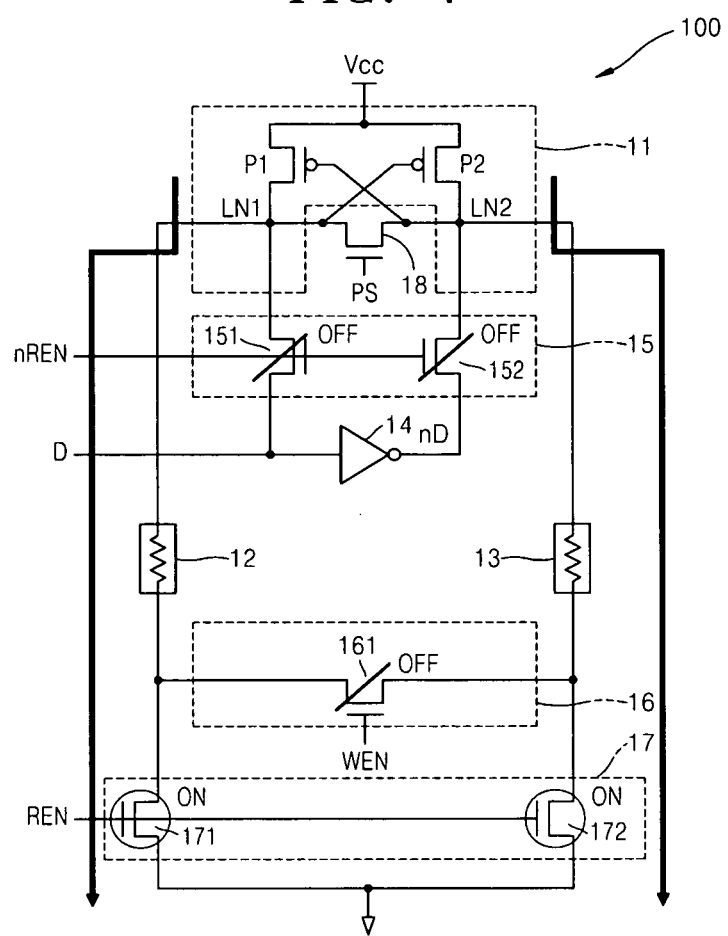
FIG. 7 is a circuit diagram illustrating a read operation performed by the latch circuit of FIG. 4, according to example embodiments.

FIG. 7 is a circuit diagram illustrating a read operation performed by the latch circuit 100 of FIG. 4, according to example embodiments. Referring to FIG. 7, when the latch circuit 100 performs a read operation, a read enable signal REN and a pulse signal PS are activated and a write enable signal WEN is not activated. In this case, an active duration of the pulse signal PS is shorter than an active duration of the read enable signal REN. Thus, the equalization unit 18 first connects the first latch node LN1 to the second latch node LN2, thereby equalizing the voltages of the first and second latch nodes LN1 and LN2 with each other.

Also, the first and second transmission units 151 and 152 are deactivated, and the input data D and the inverted input data nD are not delivered to the first and second latch nodes LN1 and LN2, respectively. The write switch 161 of the write operation selection unit 16 is open and the first and second read switches 171 and 172 of the read operation selection unit 17 are closed. Accordingly, the first and second nonvolatile memory cells 12 and 13 are connected to the first and second latch nodes LN1 and LN2, respectively, as marked by a thick solid arrow, and thus, the data stored in the respective first and second nonvolatile memory cells 12 and 13 are delivered to the first and second latch nodes LN1 and LN2.

In this case, the activated read enable signal REN is supplied to the first and second read switches 171 and 172 in order to close the first and second read switches 171 and 172, thereby forming a current path for performing the read operation. If the read enable signal REN has a high voltage, a higher amount of current enough to perform an erroneous write operation may be supplied to the first and second nonvolatile memory cells 12 and 13. The amount of current supplied to the first and second nonvolatile memory cells 12 and 13 during the read operation may be controlled by controlling a voltage of the activated read enable signal REN.

Figure 8:
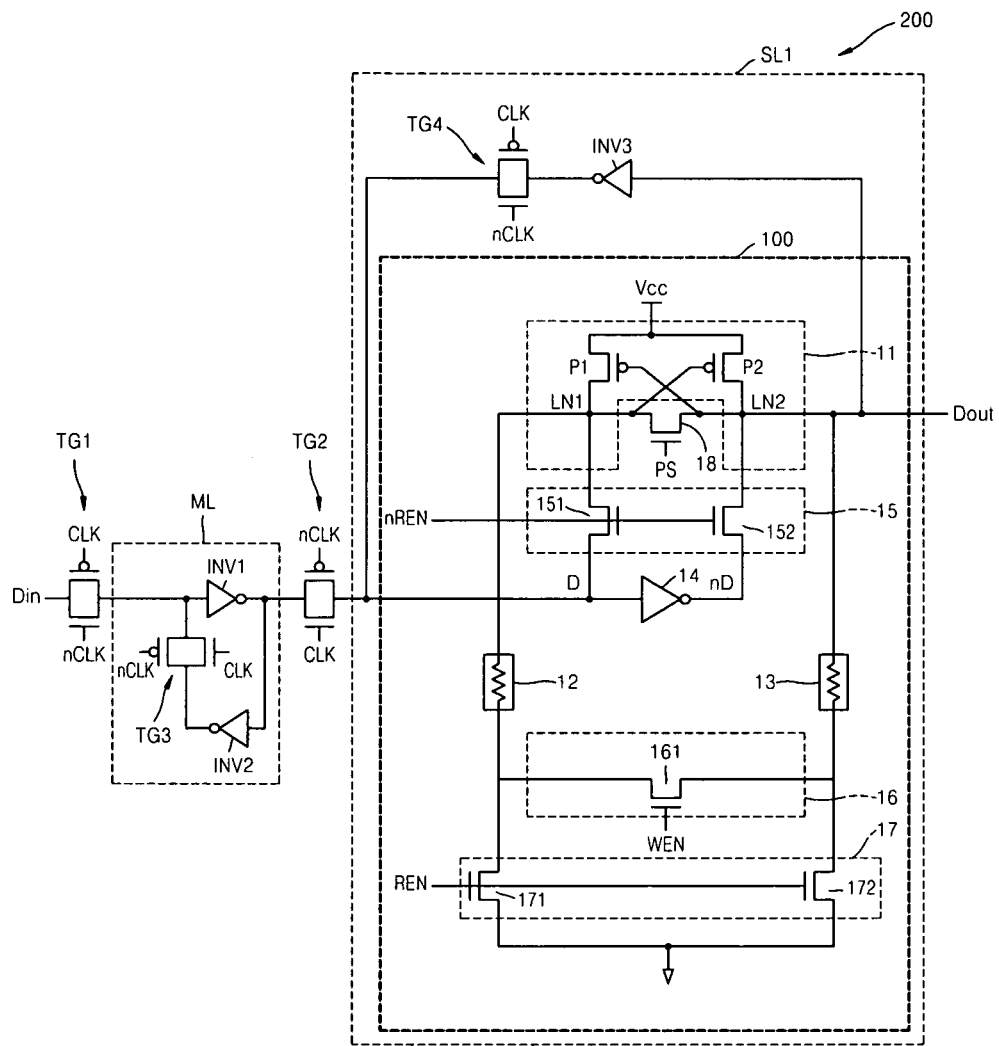
FIG. 8 is a circuit diagram of the flip flops included in integrated circuit of FIG. 1, according to example embodiments.

FIG. 8 is a circuit diagram of the flip flops 10 to 30 of FIG. 1, according to example embodiments. Referring to FIG. 8, flip flop 200 may be a master slave flip flop having a mater latch ML and a slave latch SL1. The flip flop 200 may further include first and second transmission gates TG1 and TG2. The first transmission gate TG1 may be switched on/off according to a clock signal CLK/inverted clock signal nCLK and may transmit input data Din to the master latch ML. The second transmission gate TG2 may be switched on/off according to the clock signal CLK/inverted clock signal nCLK and may transmit output data of the master latch ML to the slave latch SL.

The master latch ML may include first and second inverters INV1 and INV2 that are cross coupled to each other and may further include a third transmission gate TG3. The third transmission gate TG3 may be switched on/off according to the clock signal CLK/inverted clock signal nCLK and may transmit an output of the second inverter INV2 to the first inverter INV1.

The slave latch SL1 may include the latch circuit 100 of FIG. 4, for example. The slave latch SL1 may further include a third inverter INV3 and a fourth transmission gate TG4. The third inverter INV3 may invert data of the second latch node LN2 in the latch circuit 100, and the fourth transmission gate TG4 may be switched on/off according to the clock signal CLK/inverted clock signal nCLK and may transmit an output of the third inverter INV3 to an input terminal of the latch circuit 100.

A normal operation, a read operation, and a write operation of the flip flop 200 are described.

When the flip flop 200 performs the normal operation, a read enable signal REN and a write enable signal WEN are not activated and a pulse signal PS are not activated. Thus, the first and second transmission units 151 and 152 are activated to transmit output data D of the master latch ML and inverted output data nD to the first and second latch nodes LN1 and LN2, respectively. The write switch 161 of the write operation selection unit 16 is then opened, the first and second read switches 171 and 172 of the read operation selection unit 17 are open, and the equalization unit 18 is deactivated. Accordingly, the latch unit 11 is not connected to the first and second nonvolatile memory cells 12 and 13, and thus, the latch circuit 100 operates as a normal latch circuit and the flip flop 200 operates as a normal master slave flip flop.

When the flip flop 200 performs the write operation, the write enable signal WEN is activated and the read enable signal REN and the pulse signal PS are not activated. Thus, the first and second transmission units 151 and 152 are activated to transmit the output data D of the master latch ML and the inverted output data nD to the first and second latch nodes LN1 and LN2, respectively. The write switch 161 of the write operation selection unit 16 is then closed, the first and second read switches 171 and 172 of the read operation selection unit 17 are open, and the equalization unit 18 is deactivated. Accordingly, a closed circuit is formed with respect to the first and second latch nodes LN1 and LN2 and the first and second nonvolatile memory cells 12 and 13. A logic value of data of the first latch node LN1 is different from that of the data of the second latch node LN2, and a direction of current flowing through the closed circuit may be determined by the data of the respective first and second latch nodes LN1 and LN2.

Figure 9:
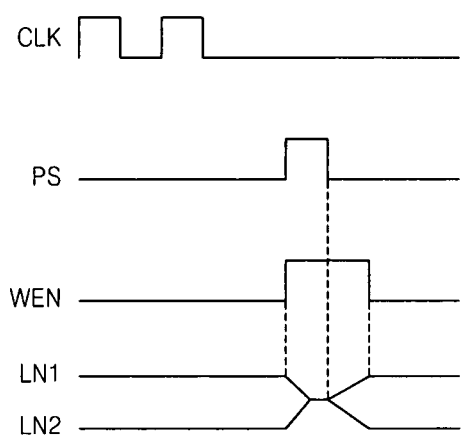
FIG. 9 is a timing diagram illustrating a write operation performed by the flip flop of FIG. 8, according to example embodiments.

FIG. 9 is a timing diagram illustrating a write operation performed by the flip flop 200 of FIG. 8 according to example embodiments. Referring to FIGS. 8 and 9, input data Din supplied to the flip flop 200 is transmitted to the slave latch SL1 after two cycles of a clock signal CLK. Next, if a write enable signal WEN is activated, then the write switch 161 is closed and the first and second latch nodes LN1 and LN2 and the first and second nonvolatile memory cells 12 and 13 form a closed circuit with respect to each other. Accordingly, the directions in which current is supplied to the first and second nonvolatile memory cells 12 and 13, respectively, depend on data of the first latch node LN1 and the second latch node N2, and, therefore, a logic value of data written to the first second nonvolatile memory cell 12 is different from that of data written to the second nonvolatile memory cell 13.

In other words, if, for example, the data of the first latch node LN1 is logic 'high' and the data of the second latch node LN2 is logic 'low', then current may flow from the first latch node LN1 to the first nonvolatile memory cell 12. Thus, a current is supplied in a downward direction, for example, in a first direction, to the first nonvolatile memory cell 12 and a current is supplied in an upward direction, for example, in a second direction, to the second nonvolatile memory cell 13. Since the current is supplied to the first and second nonvolatile memory cells 12 and 13 in different directions, a logic value of data written to the first second nonvolatile memory cell 12 is different from that of data written to the second nonvolatile memory cell 13.

If, for example, the data of the first latch node LN1 is logic 'low' and the data of the second latch node LN2 is logic 'high', then current may flow from the second latch node LN2 to the second nonvolatile memory cell 13. Thus, a current is supplied in a downward direction, for example, in the first direction, to the second nonvolatile memory cell 13 and the current is supplied in an upward direction, for example, in the second direction, to the first nonvolatile memory cell 12. Since the current is supplied to the first and second nonvolatile memory cells 12 and 13 in different directions, a logic value of data written to the first nonvolatile memory cell 12 is different from that of data written to the second nonvolatile memory cell 13.

Referring back to FIG. 8, when the flip flop 200 performs the read operation, both the read enable signal REN and the pulse signal PS are activated and the write enable signal WEN is not activated. In this case, an active duration of the pulse signal PS is shorter than an active duration of the read enable signal REN. Thus, first, the equalization unit 18 connects the first latch node LN1 to the second latch node LN2, thereby equalizing the voltages of the first and second latch nodes LN1 and LN2 with each other.

Also, the first and second transmission units 151 and 152 are deactivated, and thus, the output data D of the master latch ML and the inverted output data nD are not transmitted to the first and second latch nodes LN1 and LN2, respectively. Then, the write switch 161 of the write operation selection unit 16 is open and the first and second read switches 171 and 172 of the read operation selection unit 17 are closed. Accordingly, the first and second nonvolatile memory cells 12 and 13 are connected to the first and second latch nodes LN1 and LN2, respectively, and thus, the data stored in the first and second nonvolatile memory cells 12 and 13 are transmitted to the first and second latch nodes LN1 and LN2, respectively.

Figure 10:
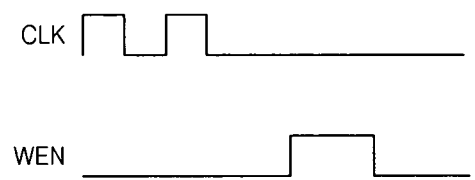
FIG. 10 is a timing diagram illustrating a read operation performed by the flip flop of FIG. 8, according to example embodiments.

FIG. 10 is a timing diagram illustrating a read operation performed by the flip flop 200 of FIG. 8, according to example embodiments. Referring to FIGS. 8 and 10, the input data Din supplied to the flip flop 200 is transmitted to the slave latch SL1 after two cycles of a clock signal CLK. Next, if a pulse signal PS is activated, the first and second latch nodes LN1 and LN2 of the slave latch SL1 are connected to equalize the voltage of the first latch node LN1 with the voltage of the second latch node LN2. When the voltages of the respective first and second latch nodes LN1 and LN2 are equalized with each other, the pulse signal PS is deactivated. Equalizing the voltages of the first and second latch nodes LN1 and LN2 prior to the read operation may result in clear sensing of the data stored in the first and second nonvolatile memory cells 12 and 13.

Also, when the read enable signal REN is activated, the first and second nonvolatile memory cells 12 and 13 are connected to the first latch node LN1 and the second latch node LN2, respectively. Thus, the data stored in the respective first and second nonvolatile memory cells 12 and 13 are delivered to the first latch node LN1 and the second latch node LN2, respectively, and the read operation is performed on the first and second nonvolatile memory cells 12 and 13.

Figure 11:
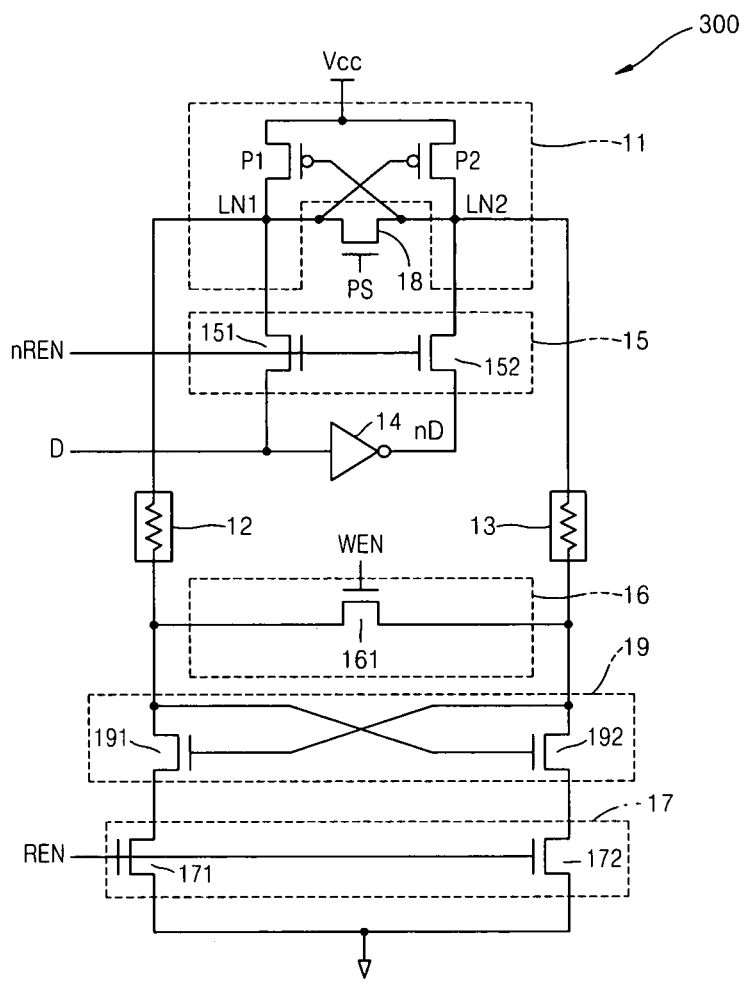
FIG. 11 is a circuit diagram of a latch circuit included in the flip flops of the integrated circuit of FIG. 1, according to example embodiments.

FIG. 11 is a circuit diagram of a latch circuit 300 of the flip flops 10 to 30 of FIG. 1, according to example embodiments. Referring to FIG. 11, the latch circuit 300 may include a latch unit 11, first and second nonvolatile memory cells 12 and 13, an inverter 14, a transmission unit 15, a write operation selection unit 16, a read operation selection unit 17, an equalization unit 18 and an auxiliary read unit 19. The latch circuit 300 of FIG. 11 is fabricated by modifying the structure of the latch circuit 100 of FIG. 4, and thus, the structure and operation of similar elements of the latch circuit 300 and the latch circuit 100 are omitted for the sake of brevity.

The auxiliary read unit 19 assists in performing a read operation on the first and second nonvolatile memory cells 12 and 13 and may include first and second auxiliary switches 191 and 192. The first auxiliary switch 191 is switched on/off according to data stored in the second nonvolatile memory cell 13 and connects the first nonvolatile memory cell 12 to the first read switch 171. The second auxiliary switch 192 is switched on/off according to data stored in the first nonvolatile memory cell 12 and connects the second nonvolatile memory cell 13 to the second read switch 172.

The first auxiliary switch 191 may include an NMOS transistor having a drain connected to the first nonvolatile memory cell 12, a source connected to the first read switch 171, and a gate connected to the second nonvolatile memory cell 13. The second auxiliary switch 192 may include an NMOS transistor having a drain connected to the second nonvolatile memory cell 13, a source connected to the second read switch 172, and a gate connected to the first nonvolatile memory cell 13.

A normal operation, a write operation, and a read operation of the latch circuit 300 according to example embodiments are described.

When the latch circuit 300 performs the normal operation, a read enable signal REN and a write enable signal WEN are not activated and a pulse signal PS is not activated. In this case, the normal operation of the latch circuit 300 is somewhat similar to operation of the latch circuit 100 of FIG. 4 and a description thereof is omitted for the sake of brevity.

When the latch circuit 300 performs the write operation, the write enable signal WEN is activated and both the read enable signal REN and the pulse signal PS are not activated. In this case, the write operation of the latch circuit 300 is somewhat similar to the operation of the latch circuit 100 of FIG. 4 and a description thereof is omitted for the sake of brevity.

When the latch circuit 300 performs the read operation, both the read enable signal REN and the pulse signal PS are activated and the write enable signal WEN is not activated. Thus, the first and second transmission units 151 and 152 are deactivated and do not transmit input data D and inverted input data nD to the first and second latch nodes LN1 and LN2, respectively. The write switch 161 of the write operation selection unit 16 is open and the first and second read switches 171 and 172 of the read operation selection unit 17 are closed. The equalization unit 18 connects the first latch node LN1 to the second latch node LN2 in an active duration of the pulse signal PS, and thus, the voltage of the first latch node LN1 is equalized with that of the second latch node LN2.

If the data stored in the first nonvolatile memory cell 12 is logic 'high' and the data stored in the second nonvolatile memory cell 13 is logic 'low', then the first auxiliary switch 191 is open according to the data stored in the second nonvolatile memory cell 13 and the second auxiliary switch 192 is closed according to the data stored in the first nonvolatile memory cell 12. In this case, although the first read switch 171 is closed according to the activated read enable signal REN, current does not flow between the first nonvolatile memory cell 12 and the first read switch 171 and current flows between the second nonvolatile memory cell 13 and the second read switch 172.

If the data stored in the first nonvolatile memory cell 12 is logic 'low' and the data stored in the second nonvolatile memory cell 13 is logic 'high', then the first auxiliary switch 191 is closed according to the data stored in the second nonvolatile memory cell 13 and the second auxiliary switch 192 is open according to the data stored in the first nonvolatile memory cell 12. In this case, although the second read switch 172 is closed according to the activated read enable signal REN, current does not flow between the second nonvolatile memory cell 13 and the second read switch 172 and current flows between the first nonvolatile memory cell 12 and the first read switch 171.

As described above, the latch circuit 300 includes the first and second auxiliary switches 191 and 192 that are connected to the first and second nonvolatile memory cells 12 and 13, respectively. Thus, during the read operation of the latch circuit 300, a current path may be formed between the logic 'low' data storing nonvolatile memory cell 12 or 13 and a ground voltage terminal. Accordingly, a current path is not formed between the logic 'high' data storing nonvolatile memory cell and the ground voltage terminal, thereby preventing leakage current.

Also, since only the logic 'low' data storing first or second nonvolatile memory cell 12 or 13 is connected to the ground voltage terminal, the latch node LN1 or LN2 connected to this nonvolatile memory cell is capable of sensing the logic 'low' data relatively quickly and the other latch node is capable sensing the logic 'high' data relatively quickly, owing to the latching of the latch unit 11. Thus, it is possible to reduce an amount of time needed to provide the data stored in the respective first and second nonvolatile memory cells 12 and 13 to the first and second latch nodes LN1 and LN2, respectively. Accordingly, not only is a speed of read operation by the latch circuit 300 increased, but also large sensing margins of the first and second latch nodes LN1 and LN2 may be obtained.

Figure 12:
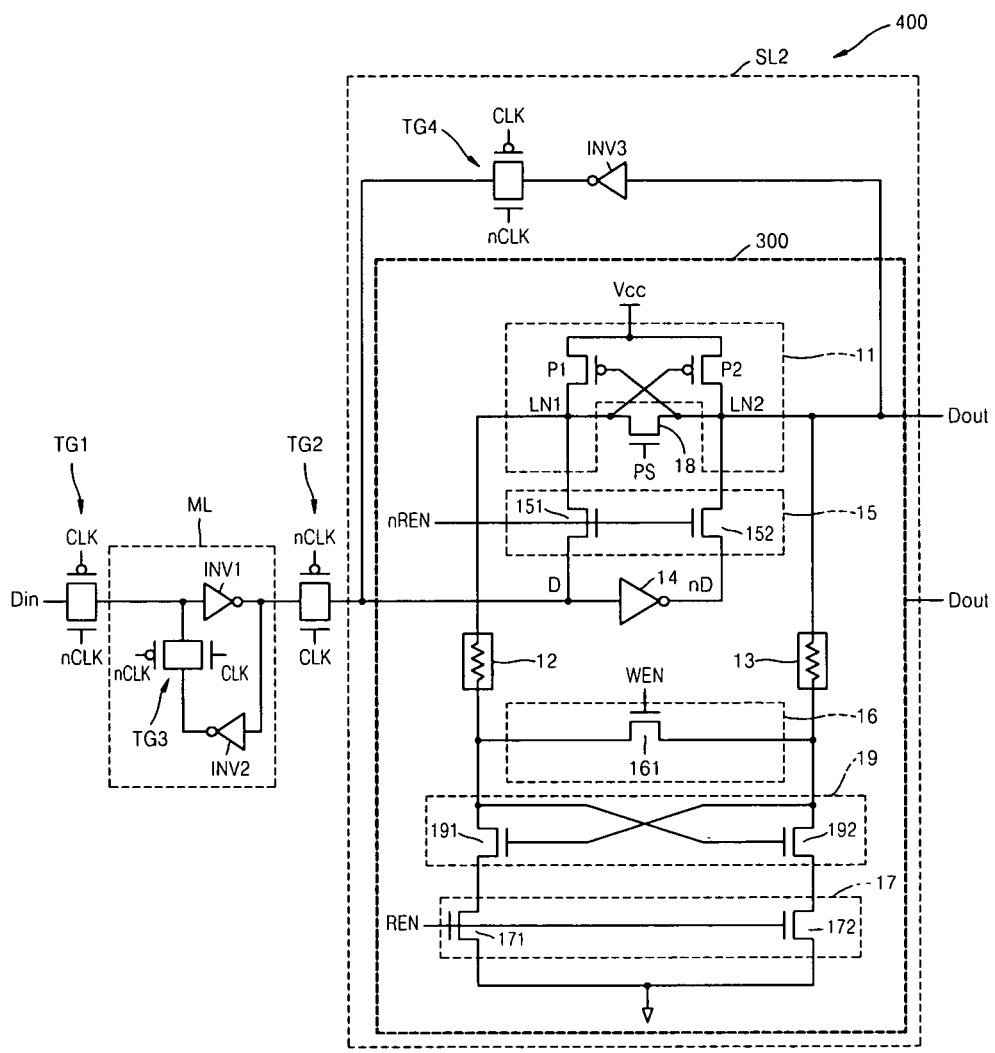
FIG. 12 is a circuit diagram of the flip flops of included in the integrated circuit of FIG. 1, according to example embodiments.

FIG. 12 is a circuit diagram of the flip flops 10 to 30 of FIG. 1, according to example embodiments. Referring to FIG. 12, flip flop 400 may be a master slave flip flop having a master latch ML and a slave latch SL2. The slave latch SL2 may include the latch circuit 300 of FIG. 11. The flip flop 400 of FIG. 12 is fabricated by modifying the structure of the flip flop 200 of FIG. 8 and a detailed description thereof is omitted for the sake of brevity.

Figure 13:
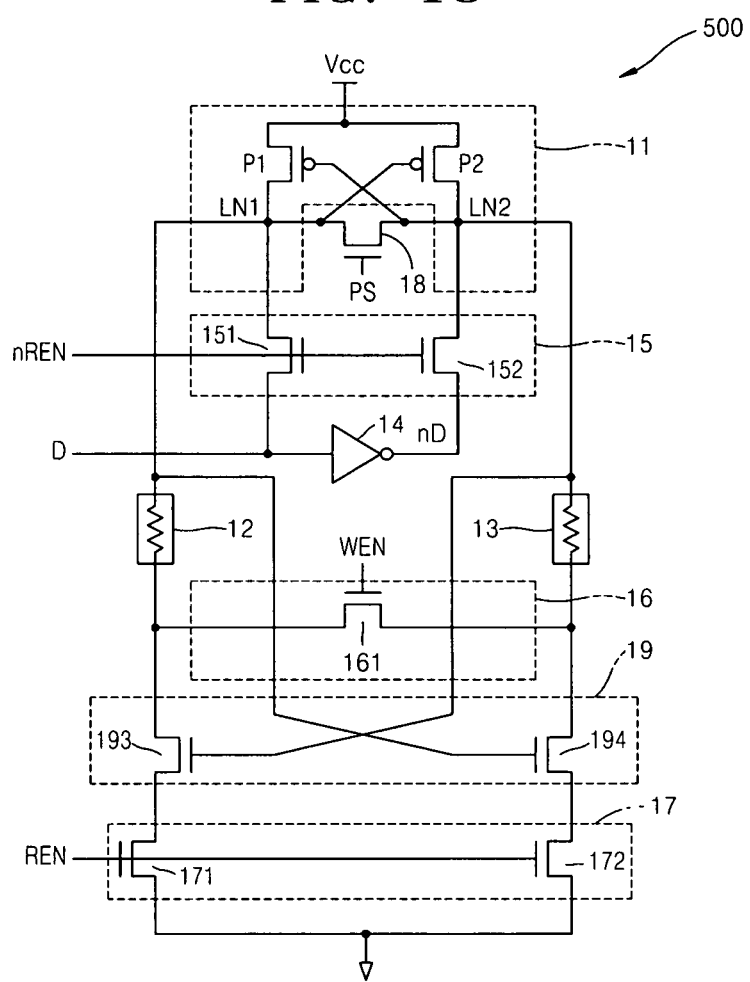
FIG. 13 is a circuit diagram, of a latch circuit included in the flip flops of the integrated circuit of FIG. 1, according to example embodiments.

FIG. 13 is a circuit diagram of the flip flops 10 to 30 of FIG. 1, according to example embodiments. Referring to FIG. 13, latch circuit 500 may include a latch unit 11, first and second nonvolatile memory cells 12 and 13, an inverter 14, a transmission unit 15, a write operation selection unit 16, a read operation selection unit 17, an equalization unit 18, and an auxiliary read unit 19. The latch circuit 500 of FIG. 13 is fabricated by modifying the structure of the latch circuit 100 of FIG. 4, and thus, the structure and operation of similar elements of the latch circuit 500 and the latch circuit 100 is omitted for the sake of brevity.

The auxiliary read unit 19 assists in performing a read operation on the first and second nonvolatile memory cells 12 and 13 and may include first and second auxiliary switches 193 and 194. The first auxiliary switch 193 is switched on/off according to data of the second latch node LN2 and connects the first nonvolatile memory cell 12 with the first read switch 171. The second auxiliary switch 194 is switched on/off according to data of the first latch node LN1 and connects the second nonvolatile memory cell 13 with the second read switch 172.

The first auxiliary switch 193 may include an NMOS transistor having a drain connected to the first nonvolatile memory cell 12, a source connected to the first read switch 171, and a gate connected to the second latch node LN2. The second auxiliary switch 194 may include an NMOS transistor having a drain connected to the second nonvolatile memory cell 13, a source connected to the second read switch 172, and a gate connected to the first latch node LN1.

A normal operation, a write operation, and a read operation of the latch circuit 500 are described.

When the latch circuit 500 performs the normal operation, a read enable signal REN and a write enable signal WEN are not activated and a pulse signal PS is not activated. The normal operation of the latch circuit 300 is somewhat similar to the normal operation of the latch circuit 100 of FIG. 4 and a detailed description thereof is omitted for the sake of brevity.

When the latch circuit 500 performs the write operation, the write enable signal WEN is activated and both the read enable signal REN and the pulse signal PS are not activated. The write operation of the latch circuit 300 is somewhat similar to the write operation of the latch circuit 100 of FIG. 4 and a detailed description thereof is omitted for the sake of brevity.

When the latch circuit 500 performs the read operation, both the read enable signal REN and the pulse signal PS are activated and the write enable signal WEN is not activated. Thus, the first and second transmission units 151 and 152 are deactivated, and thus, input data D and inverted input data nD are not transmitted to the first and second latch nodes LN1 and LN2, respectively. The write switch 161 of the write operation selection unit 16 is open and the first and second read switches 171 and 172 of the read operation selection unit 17 are closed. The equalization unit 18 connects the first latch node LN1 with the second latch node LN2 during an active section of the pulse signal PS, and the voltage of the first latch node LN1 is equalized with that of with the second latch node LN2. Therefore, the first and second auxiliary switches 193 and 194 may be closed according to the equalized voltages of the respective first and second latch nodes LN1 and LN2.

If data stored in the first nonvolatile memory cell 12 is logic 'high' and data stored in the second nonvolatile memory cell 13 is logic 'low', then the first nonvolatile memory cell 12 is in a low resistance state and the second nonvolatile memory cell 13 is in a high resistance state. Since a number of electric charges passing through the first nonvolatile memory cell 12 may be greater than that of electric charges passing through the second nonvolatile memory cell 13, a speed at which current flows through the first nonvolatile memory cell 12 may be higher than a speed at which current flows through the second nonvolatile memory cell 13. Thus, the first latch node LN1 may sense the data stored in the first nonvolatile memory cell 12 relatively quickly and is logic 'high', and the second latch node LN2 may sense the data that is logic 'low' owing to the latching of the latch unit 11. Accordingly, it is possible to reduce a time required to provide the data stored in the respective first and second nonvolatile memory cells 12 and 13 to the first and second latch nodes LN1 and LN2, respectively. Thus, not only is a speed of the read operation by the latch circuit 300 increased but also relatively large sensing margins of the first and second latch nodes LN1 and LN2 may be obtained.

If data stored in the first nonvolatile memory cell 12 is logic 'low' and data stored in the second nonvolatile memory cell 13 is logic 'high', then the first nonvolatile memory cell 12 is in a high resistance state and the second nonvolatile memory cell 13 is in a low resistance state. Since a number of electric charges passing through the second nonvolatile memory cell 13 may be greater than the electric charges passing through the first nonvolatile memory cell 12, a speed at which current flows through the second nonvolatile memory cell 13 may be higher than a speed at which current flows through the first nonvolatile memory cell 12. Thus, the second latch node LN2 may sense the data that is stored in the second nonvolatile memory cell 13 relatively quickly and is logic 'high', and the first latch node LN1 may sense data that is logic 'low' relatively quickly owing to the latching of the latch unit 11. Accordingly, it is possible to reduce a time required to provide the data stored in the respective first and second nonvolatile memory cells 12 and 13 to the first and second latch nodes LN1 and LN2, respectively. Thus, not only is a speed of the read operation by the latch circuit 300 increased but also relatively large sensing margins of the first and second latch nodes LN1 and LN2 may be obtained.

As described above, since the latch circuit 500 includes the first and second auxiliary switches 193 and 194 that are connected to the first and second latch nodes LN1 and LN2, respectively, a time needed to apply a gate voltage to the first and second auxiliary switches 193 and 194, respectively, may be reduced regardless of resistance values of the first and second nonvolatile memory cells 12 and 13. Therefore, a time needed to close the first and second auxiliary switches 193 and 194 may be reduced, thereby increasing the speed of the read operation by the latch circuit 500.

Also, while the read operation is performed, the data of the first or second latch node LN1 or LN2 is logic 'low', and thus, the auxiliary switch 193 or 194 connected thereto is open. Thus, a current path is not formed during the read operation, thereby reducing a leakage current among the first and second nonvolatile memory cells 12 and 13 and a ground voltage terminal.

Figure 14:
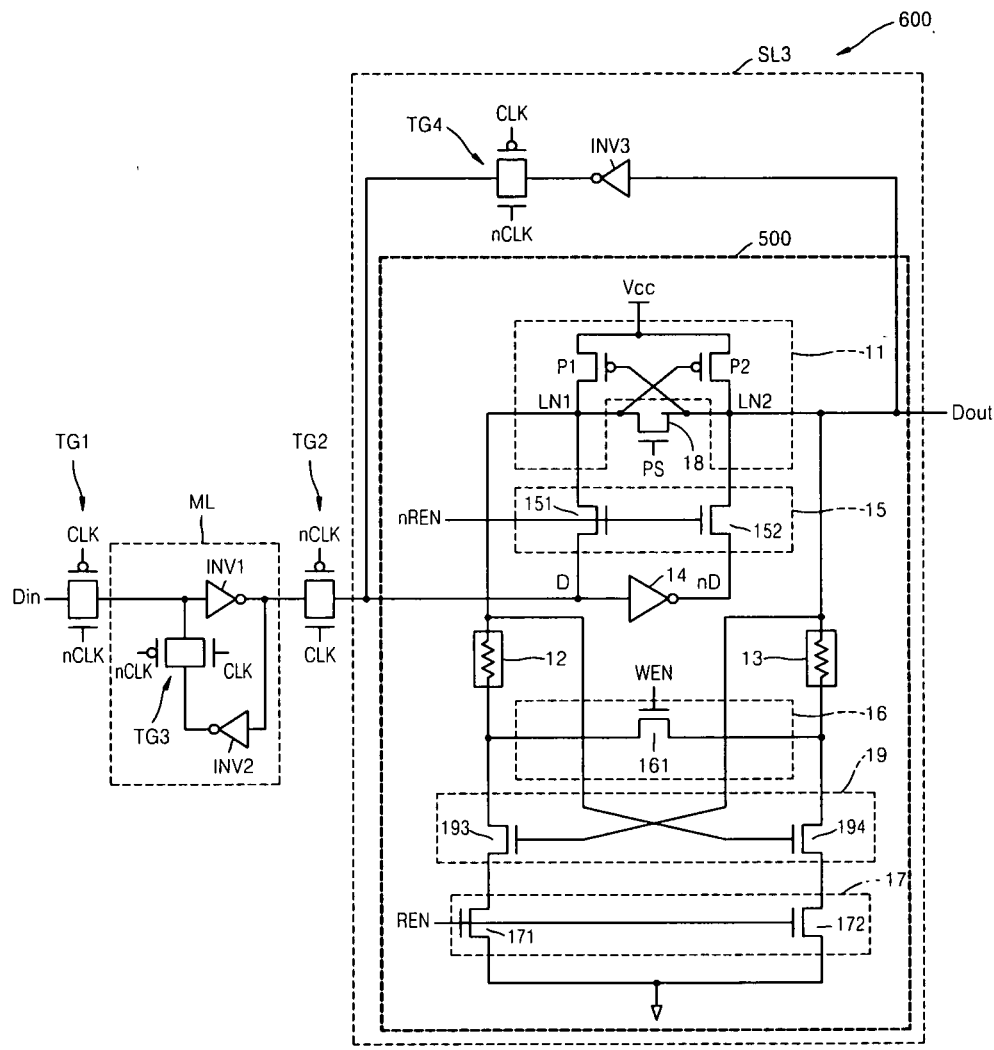
FIG. 14 is a circuit diagram of the flip flops included in integrated circuit of FIG. 1, according to example embodiments.

FIG. 14 is a circuit diagram of the flip flops 10 to 30 included in integrated circuit of FIG. 1, according to example embodiments. Referring to FIG. 14, flip flop 600 may be a master slave flip flop having a master latch ML and a slave latch SL3. The slave latch SL3 may include the latch circuit 500 of FIG. 13. The flip flop 600 of FIG. 14 is fabricated by modifying the structure of the flip flop 200 of FIG. 8 and a detailed description thereof is omitted for the sake of brevity.

Figure 15:
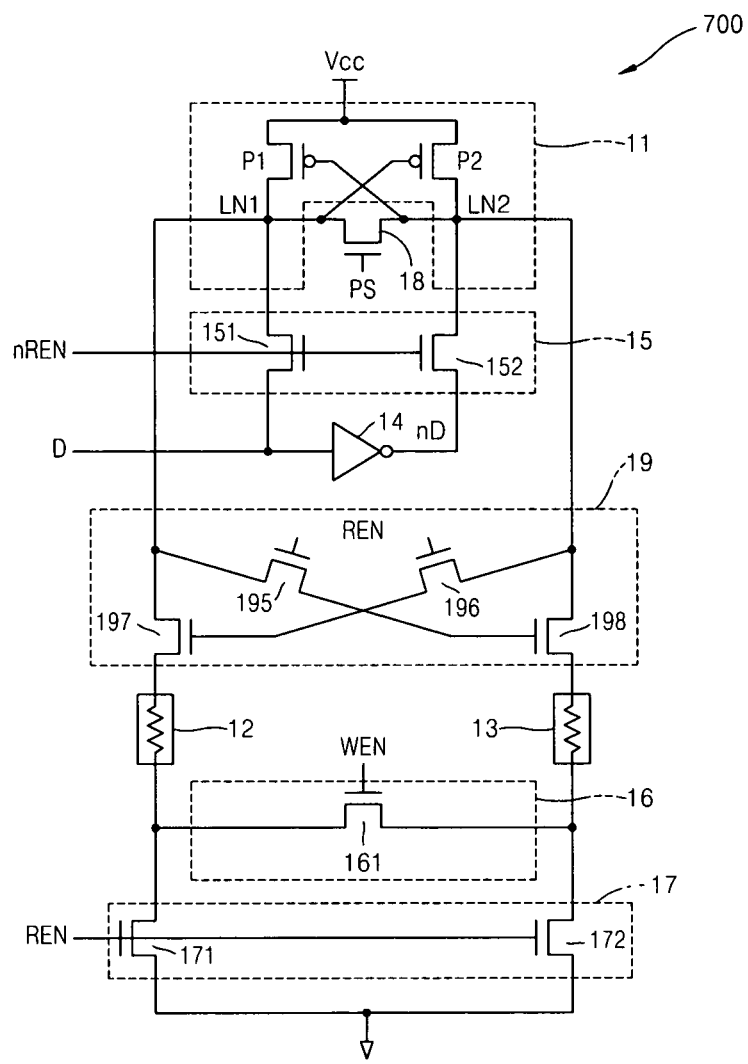
FIG. 15 is a circuit diagram of a latch circuit included in the flip flops of the integrated circuit of FIG. 1, according to example embodiments.

FIG. 15 is a circuit diagram of the flip flops 10 to 30 of FIG. 1, according to example embodiments. Referring to FIG. 15, the latch circuit 700 may include a latch unit 11, first and second nonvolatile memory cells 12 and 13, an inverter 14, a transmission unit 15, a write operation selection unit 16, a read operation selection unit 17, an equalization unit 18, and an auxiliary read unit 19. The latch circuit 700 of FIG. 15 is fabricated by modifying the structure of the latch circuit 100 of FIG. 4, and a description of the elements of the latch circuit 700 that similar to the latch circuit 100 is omitted for the sake of brevity.

The auxiliary read unit 19 assists in performing a read operation on the first and second nonvolatile memory cells 12 and 13, and may include first and second transmission switches 195 and 196 and first and second auxiliary switches 197 and 198. The first and second transmission switches 195 and 196 may be switched on/off according to a read enable signal REN and may transmit data to first and second latch nodes LN1 and LN2, respectively. Also, the first auxiliary switch 197 is switched on/off according to an output of the second transmission switch 196 and connects the first latch node LN1 to the first nonvolatile memory cell 12, and the second auxiliary switch 198 is switched on/off according to an output of the first transmission switch 195 and connects the second latch node LN2 to the second nonvolatile memory cell 13.

The first transmission switch 195 may include an NMOS transistor having a drain connected to the first latch node LN1 and a gate to which the read enable signal REN is supplied, and the second transmission switch 196 may include an NMOS transistor having a drain connected to the second latch node LN2 and a gate to which the read enable signal REN is supplied. The first auxiliary switch 197 may include an NMOS transistor having a drain connected to the first latch node LN1, a source connected to the first nonvolatile memory cell 12, and a gate connected to the second transmission switch 196. The second auxiliary switch 198 may include an NMOS transistor having a drain connected to the second latch node LN2, a source connected to the second nonvolatile memory cell 13, and a gate connected to the first transmission switch 195.

A normal operation, a write operation, and a read operation of the latch circuit 700 are described.

When the latch circuit 700 performs the normal operation, the read enable signal REN and a write enable signal WEN are not activated and a pulse signal PS is not activated. In this case, the operation of the latch circuit 700 is somewhat similar to that of the latch circuit 100 of FIG. 4 and a detailed description thereof is omitted for the sake of brevity.

When the latch circuit 700 performs the write operation, the write enable signal WEN is activated and the read enable signal REN and the pulse signal PS are not activated. In this case, the write operation of the latch circuit 700 is somewhat similar to that of the latch circuit 100 of FIG. 4 and a detailed description thereof is omitted for the sake of brevity.

When the latch circuit 700 performs the read operation, the read enable signal REN and the pulse signal PS are activated and the write enable signal WEN is not activated. Thus, the first and second transmission units 151 and 152 are deactivated and thus do not transmit input data D and inverted input data nD to the first and second latch nodes LN1 and LN2, respectively. The write switch 161 of the write operation selection unit 16 is open and the first and second read switches 171 and 172 of the read operation selection unit 17 are closed. In this case, the first and second transmission switches 195 and 196 of the auxiliary read unit 19 are closed, and thus, the first transmission switch 195 transmits the input data D of the first latch node LN1 to the second auxiliary switch 198 and the second transmission switch 196 transmits the inverted input data nD of the second latch node LN2 to the first auxiliary switch 197.

The equalization unit 18 connects the first latch node LN1 with the second latch node LN2 during an active duration of the pulse signal PS, thereby equalizing a voltage of the first latch node LN1 with that of the second latch node LN2. Thus, the voltage of the first latch node LN1 is transmitted to the second auxiliary switch 198 via the first transmission switch 195 and the voltage of the second latch node LN2 is transmitted to the first auxiliary switch 197 via the second transmission switch 196. The first and second auxiliary switches 197 and 198 may be closed according to the equalized voltages of the first latch node LN1 and the second latch node LN2.

If data stored in the first nonvolatile memory cell 12 is logic 'high' and data stored in the second nonvolatile memory cell 13 is logic 'low', then the first nonvolatile memory cell 12 is in a low resistance state and the second nonvolatile memory cell 13 is in a high resistance state. Thus, for a given time, a number of electric charges passing through the first nonvolatile memory cell 12 may be greater than a number of electric charges passing through the second nonvolatile memory cell 13, a speed at which current flows through the first nonvolatile memory cell 12 may be higher than a speed at which current flows through the second nonvolatile memory cell 13. Thus, the first latch node LN1 is capable of sensing data that is stored in the first nonvolatile memory cell 12 relatively quickly and is logic 'high', and the second latch node LN2 is capable sensing data that is logic 'low' relatively quickly owing to the latching of the latch unit 11. Accordingly, it is possible to reduce a time required to provide the data stored in the respective first and second nonvolatile memory cells 12 and 13 to the first and second latch nodes LN1 and LN2, respectively. Thus, not only is a speed of performing the read operation by the latch circuit 300 increased, but also a relatively large sensing margin of the first and second latch nodes LN1 and LN2 may be obtained.

If the data stored in the first nonvolatile memory cell 12 is logic 'low' and the data stored in the second nonvolatile memory cell 13 is logic 'high', then the first nonvolatile memory cell 12 is in a high resistance state and the second nonvolatile memory cell 13 is in a low resistance state. Thus, for a given time, the number of electric charges passing through the second nonvolatile memory cell 13 may be greater than that of electric charges passing through the first nonvolatile memory cell 12, a speed at which current flows through the second nonvolatile memory cell 13 may be higher than a speed at which current flows through the first nonvolatile memory cell 12. Thus, the second latch node LN2 is capable of sensing the data that is stored in the second nonvolatile memory cell 13 relatively quickly and is logic 'high', and the first latch node LN1 is capable of sensing data that is logic 'low' relatively quickly owing to the latching of the latch unit 11. Accordingly, it is possible to reduce a time required to provide the data stored in the respective first and second nonvolatile memory cells 12 and 13 to the first and second latch nodes LN1 and LN2, respectively. Thus, not only is a speed of performing the read operation by the latch circuit 300 increased, but also a relatively large sensing margin of the first and second latch nodes LN1 and LN2 may be obtained.

As described above, the latch circuit 700 includes the first and second transmission switches 195 and 196 that are closed when the read enable signal REN is activated, and includes the first and second auxiliary switches 197 and 198 that are controlled using the first and second transmission switches 195 and 196 according to the data of the first and second latch nodes LN1 and LN2. Thus, it is possible to reduce a time required to apply a voltage to the first and second auxiliary switches 197 and 198 regardless of resistance values of the first and second nonvolatile memory cells 12 and 13, respectively. Accordingly, a time required to close the first and second auxiliary switches 197 and 198 is reduced, thereby performing the read operation by the latch circuit 700 at a relatively higher speed.

While the read operation is performed, the data of the first or second latch node LN1 or LN2 is logic 'low' and the first or second auxiliary switch 197 or 198 connected thereto is open. Thus, a current path is not formed during the read operation, thereby reducing a leakage current between the first or second nonvolatile memory cells 12 and 13 and a ground voltage terminal.

Figure 16:
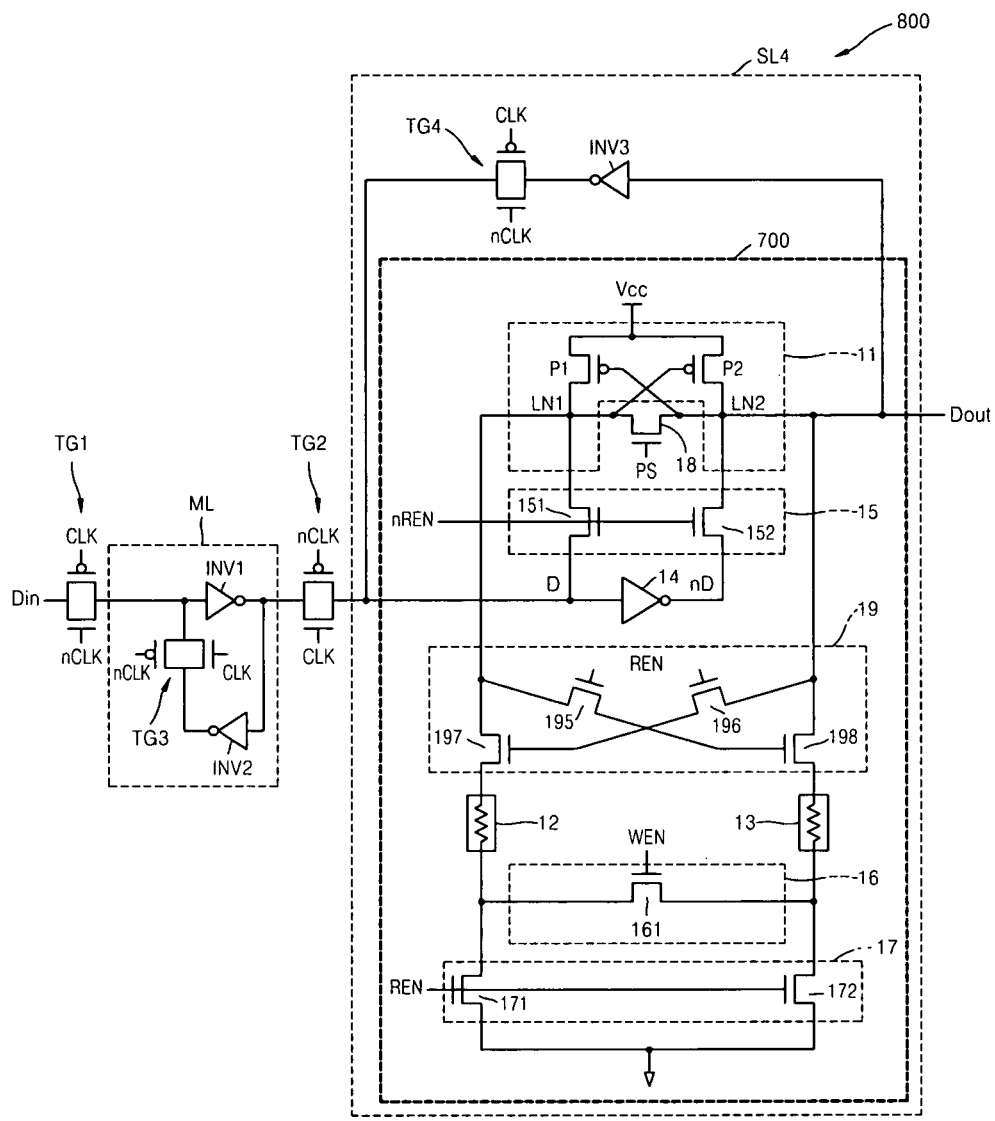
FIG. 16 is a circuit diagram of a latch circuit included in the flip flops included in the integrated circuit of FIG. 1, according to example embodiments.

FIG. 16 is a circuit diagram of a latch circuit 800 included in flip flops 10 to 30 of FIG. 1, according to example embodiments. Referring to FIG. 16, the flip flop 800 may be a master slave flip flop having a master latch ML and a slave latch SL4.

The slave latch SL4 may include the latch circuit 700 of FIG. 15. The flip flop 800 is fabricated by modifying the structure of flip flop 200 of FIG. 8 and a detailed description thereof is omitted for the sake of brevity.

The integrated circuit according example embodiments may be included in an electronic apparatus or system. For example, the integrated circuit may be embodied as a single chip in an electronic apparatus or system. As described above, logic circuits included in a plurality of chips of an electronic apparatus or system may include nonvolatile memory cells. Thus, even if power is suddenly cut-off, data stored in the electronic apparatus or system may be retained in the nonvolatile memory cells and the electronic apparatus or system may be booted quickly when power is supplied again thereto.

As described in the above example embodiments, a nonvolatile logic circuit includes a latch unit having a pair of latch nodes and a pair of nonvolatile memory cells and performs a write operation on the pair of nonvolatile memory cells when a write enable signal is activated. Thus, although the nonvolatile memory cells have a finite reliability, the nonvolatile logic circuit may be operated stably.

Also, according to example embodiments, the nonvolatile logic circuit transmits data stored in the nonvolatile memory cells to the pair of latch nodes, respectively, when a read enable signal is activated. Thus, the data stored in the nonvolatile memory cells prior to power loss may be quickly read when power is supplied again. Accordingly, the nonvolatile logic circuit may be booted in a simple manner and directly without having to access an external ROM, thereby greatly reducing a booting time.

Also, according example embodiments, even if power is cut off, data stored in the nonvolatile logic circuit may be written to the nonvolatile memory cells by generating a sense signal and activating a write enable signal and the data may be read from the nonvolatile memory cells when power is supplied again.

Also, according example embodiments, the nonvolatile logic circuit may further include an auxiliary read unit having a plurality of NMOS transistors and may thus cut off a current path connected to a nonvolatile memory cell that stores data that is logic 'high' during a read operation. Accordingly, it is possible to reduce leakage current that may be generated during the read operation and to increase a speed of performing the read operation.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A nonvolatile logic circuit comprising:
a latch unit including a pair of first and second latch nodes; and
a pair of first and second nonvolatile memory cells electrically connected to the first and second of latch nodes, respectively;
an inverter configured to invert an input data and to output an inverted input data;
a first transmission unit configured to transmit the input data to the first latch node when a read enable signal is not activated; and
a second transmission unit configured to transmit the inverted input data to the second latch node when the read enable signal is not activated, wherein a write operation is performed on the first and second nonvolatile memory cells by supplying current to the first and second nonvolatile memory cells in different directions when a write enable signal is activated, the direction of flow of current being determined based on a logic value of data stored on the respective first and second latch nodes, and a logic value stored in the first nonvolatile memory cell is different from a logic value stored in the second nonvolatile memory cell.

2. The nonvolatile logic circuit of claim 1, wherein, when a read enable signal is activated, the first and second nonvolatile memory cells are electrically connected to the first and second latch nodes, respectively, and the logic value written to the respective first and second nonvolatile memory cells is provided to the respective first and second latch nodes.

3. The nonvolatile logic circuit of claim 2, wherein the first and second nonvolatile memory cells are not electrically connected to the respective first and second latch nodes when the read enable signal and the write enable signal are not activated.

4. The nonvolatile logic circuit of claim 1, further comprising:
a read operation selection unit configured to provide the logic value stored in the first nonvolatile memory cell to the first latch node and the logic value stored in the second nonvolatile memory cell to the second latch node, when the read enable signal is activated; and
a write operation selection unit configured to supply the currents to the first and second nonvolatile memory cells when the write enable signal is activated.

5. The nonvolatile logic circuit of claim 4, further comprising:
an equalization unit configured to connect the first and second latch nodes when a pulse signal is activated, wherein connecting the first and second latch nodes equalizes voltage levels of the data stored on the first and second latch nodes.

6. The nonvolatile logic circuit of claim 4, wherein the write operation selection unit comprises:
a write switch configured to connect the first and second nonvolatile memory cells to form a closed circuit including the first and second latch nodes and the first and second nonvolatile memory cells when the write enable signal is activated.

7. The nonvolatile logic circuit of claim 4, wherein the read operation selection unit comprises:
first and second read switches configured to connect the first and second nonvolatile memory cells to a ground voltage terminal when the read enable signal is activated.

8. The nonvolatile logic circuit of claim 7, further comprising an auxiliary read unit configured to perform a read operation on the first and second nonvolatile memory cells, wherein the auxiliary read unit includes:
a first auxiliary switch that is switched on/off according to the data stored in the second nonvolatile memory cell, and is configured to connect the first nonvolatile memory cell to the first read switch; and
a second auxiliary switch that is switched on/off according to the data stored in the first nonvolatile memory cell and is configured to connect the second nonvolatile memory cell to the second read switch.

9. The nonvolatile logic circuit of claim 7, further comprising an auxiliary read unit configured to perform a read operation on the first and second nonvolatile memory cells, wherein the auxiliary read unit includes:

a first auxiliary switch that is switched on/off according to the data of the second latch node, and is configured to connect the first nonvolatile memory cell to the first read switch; and
a second auxiliary switch that is switched on/off according to the data of the first latch node and is configured to connect the second nonvolatile memory cell to the second read switch.

10. The nonvolatile logic circuit of claim 7, further comprising an auxiliary read unit configured to perform a read operation on the first and second nonvolatile memory cells, wherein the auxiliary read unit includes:
first and second transmission switches that are switched on/off according to the read enable signal and respectively transmit the data of the first and second latch nodes;
a first auxiliary switch that is switched on/off according to an output of the second transmission switch and is configured to connect the first latch node to the first nonvolatile memory cell; and
a second auxiliary switch that is switched on/off according to an output of the first transmission switch and is configured to connect the second latch node to the second nonvolatile memory cell.

11. A logic circuit comprising:
a master latch configured to latch input data; and
a slave latch configured to latch output data of the master latch, wherein the slave latch includes a nonvolatile logic circuit, the nonvolatile logic circuit including,
a latch unit including a pair of first and second latch nodes; and
a pair of first and second nonvolatile memory cells electrically connected to the first and second of latch nodes, respectively, wherein
a write operation is performed on the first and second nonvolatile memory cells by supplying current to the first and second nonvolatile memory cells in different directions when a write enable signal is activated, the direction of flow of current being determined based on a logic value of data stored on the respective first and second latch nodes, and
a logic value stored in the first nonvolatile memory cell is different from a logic value stored in the second nonvolatile memory cell.

12. The logic circuit of claim 11, wherein the nonvolatile logic circuit further comprises:
an inverter configured to invert the output data of the master latch and to output an inverted output data;
a first transmission unit configured to transmit the output data of the master latch to the first latch node when a read enable signal is not activated; and
a second transmission unit configured to transmit the inverted output data to the second latch node when the read enable signal is not activated.

13. The logic circuit of claim 12, wherein the nonvolatile logic circuit further comprises:
a read operation selection unit configured to provide the data stored in the first nonvolatile memory cell to the first latch node and the data stored in the second nonvolatile memory cell to the second latch node when the read enable signal is activated; and
a write operation selection unit configured to supply currents to the first and second nonvolatile memory cells when the write enable signal is activated.

14. The logic circuit of claim 13, wherein the nonvolatile logic circuit further comprises:

an equalization unit configured to connect the first and second latch nodes when a pulse signal is activated, wherein connecting the first and second latch nodes equalizes voltage levels of the data stored on the first and second latch nodes.

15. The logic circuit of claim 12, further comprising:
a first transmission gate configured to transmit the input data to the master latch according to a clock signal and an inverted clock signal; and
a second transmission gate configured to transmit the output data of the master latch to the slave latch according to the clock signal and the inverted clock signal.

16. The logic circuit of claim 15, wherein the slave latch further comprises:
an inverter configured to invert data stored on the second latch node; and
a third transmission gate configured to transmit an output of the inverter to an output terminal of the second transmission gate according to the clock signal and the inverted clock signal.

17. An integrated circuit comprising:
a plurality of circuit blocks including at least one logic circuit block and at least one nonvolatile logic circuit, the at least one nonvolatile logic circuit including,
a latch unit including a pair of first and second latch nodes, and
a pair of first and second nonvolatile memory cells electrically connected to the first and second of latch nodes, respectively;
a power sensor configured to generate a sense signal when a value of a power supplied to at least one of the plurality of circuit blocks is less than or equal to a threshold value; and
a controller configured to generate a read enable signal or the write enable signal based on the sense signal generated by the power sensor or an external command, wherein,
the first and second latch nodes of the nonvolatile logic circuit are configured to latch an output data of the at least one logic circuit block or an external input data,
a write operation is performed on the first and second nonvolatile memory cells by supplying current to the first and second nonvolatile memory cells in different directions when a write enable signal is activated, the direction of flow of current being determined based on a logic value of data stored on the respective first and second latch nodes, and
a logic value stored in the first nonvolatile memory cell is different from a logic value stored in the second nonvolatile memory cell.

18. The integrated circuit of claim 17, wherein the at least one nonvolatile logic circuit further comprises:
an inverter configured to invert the output data of the at least one logic circuit block or the external input data, and the inverter configured to output inverted data;
a first transmission unit configured to transmit the output data of the at least one logic circuit block or the external input data to the first latch node when the read enable signal is not activated; and
a second transmission unit configured to transmit the inverted data to the second latch node when the read enable signal is not activated.

19. The integrated circuit of claim 18, wherein the at least one nonvolatile logic circuit further comprises:
a read operation selection unit configured to provide data stored in the first nonvolatile memory cell to the first latch node and data stored in the second nonvolatile memory cell to the second latch node when the read enable signal is activated; and
a write operation selection unit configured to supply currents to the first and second nonvolatile memory cells when the write enable signal is activated.

20. The integrated circuit of claim 19, wherein the at least one nonvolatile logic circuit further comprises
an equalization unit configured to connect the first and second latch nodes when a pulse signal is activated, wherein connecting the first and second latch nodes equalizes voltage levels of the data stored on the first and second latch nodes.

21. A method of operating an integrated circuit including at least one nonvolatile logic circuit and at least one logic circuit block, the at least one nonvolatile logic circuit including a latch unit, the latch unit including a pair of first and second latch nodes and a pair of first and second nonvolatile memory cells, the method comprising:
generating a sense signal when a value of a power supplied to the at least one logic circuit block is less than or equal to a threshold value;
generating a read enable signal or a write enable signal based on the sense signal or an external command;
electrically connecting the first and second nonvolatile memory cells to the first and second latch nodes, respectively, when the write enable signal is activated; and
performing a write operation on the first and second nonvolatile memory cells by supplying current to the first and second nonvolatile memory cells in different directions based on data stored on the respective first and second latch nodes,
wherein a logic value stored in the first nonvolatile memory cell is different from a logic value stored in the second nonvolatile memory cells.

22. The method of claim 21, further comprising:
inverting an output of the at least one logic circuit block or an external input data to produce an inverted output data and outputting the inverted output data; and
transmitting the output of the at least one logic circuit block or the external input data to the first latch node and the inverted output data to the second latch node when the read enable signal is not activated.

23. The method of claim 22, further comprising at least one of:
disconnecting the first and second nonvolatile memory cells from the first and second latch nodes when the read enable signal and the write enable signal are not activated; and
providing the data stored in the first and second nonvolatile memory cells to the first and second latch nodes, respectively, when the read enable signal is activated.

24. The method of claim 23, further comprising: equalizing voltages of the data stored on the first and second latch nodes by connecting the first and second latch nodes to each other when a pulse signal is activated.

* * * * *